United States Patent
Kim et al.

(10) Patent No.: US 11,538,958 B2
(45) Date of Patent: Dec. 27, 2022

(54) DISPLAY APPARATUS AND MANUFACTURING METHOD THEREOF

(71) Applicant: SAMSUNG ELECTRONICS CO., LTD., Suwon-si (KR)

(72) Inventors: Hyunsun Kim, Suwon-si (KR); Seungryong Han, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 257 days.

(21) Appl. No.: 16/924,374

(22) Filed: Jul. 9, 2020

(65) Prior Publication Data
US 2021/0050472 A1    Feb. 18, 2021

(30) Foreign Application Priority Data

Aug. 13, 2019    (KR) .......................... 10-2019-0099103

(51) Int. Cl.
*H01L 33/00* (2010.01)
*G09F 9/302* (2006.01)
*H01L 25/075* (2006.01)

(52) U.S. Cl.
CPC .......... *H01L 33/005* (2013.01); *G09F 9/3026* (2013.01); *H01L 25/0753* (2013.01)

(58) Field of Classification Search
CPC combination set(s) only.
See application file for complete search history.

(56) References Cited

U.S. PATENT DOCUMENTS

| | | | |
|---|---|---|---|
| 8,045,270 B2 | 10/2011 | Shin et al. | |
| 8,902,128 B2 | 12/2014 | Wood et al. | |
| 9,709,241 B2 | 7/2017 | Hu et al. | |
| 9,936,177 B2 | 4/2018 | Hickl | |
| 10,324,299 B2 | 6/2019 | Lee | |
| 10,468,396 B2 | 11/2019 | Kim et al. | |
| 2005/0078104 A1 | 4/2005 | Matthies et al. | |
| 2007/0147075 A1 | 6/2007 | Bang | |
| 2013/0279012 A1 | 10/2013 | Lee et al. | |
| 2015/0186099 A1 | 7/2015 | Hall | |

(Continued)

FOREIGN PATENT DOCUMENTS

| | | |
|---|---|---|
| CN | 108267901 A | 7/2018 |
| EP | 3 477 699 A1 | 5/2019 |

(Continued)

OTHER PUBLICATIONS

International Search Report (PCT/ISA/210) dated Sep. 28, 2020 by the International Searching Authority in counterpart International Patent Application No. PCT/KR2020/009233.

(Continued)

*Primary Examiner* — Ratisha Mehta
(74) *Attorney, Agent, or Firm* — Sughrue Mion, PLLC

(57) ABSTRACT

A display apparatus and a manufacturing method thereof. The display apparatus includes a chassis, a plurality of modular displays disposed and tiled on the chassis, each of the plurality of modular displays including a plurality of light emitting diodes (LEDs) constituting each of a plurality of pixels, and a patterned molding layer formed on the each of the plurality of modular displays, wherein the patterned molding layer is formed to correspond to a boundary line between modular displays adjacent to each other among the plurality of modular displays.

10 Claims, 17 Drawing Sheets

(56) References Cited

U.S. PATENT DOCUMENTS

| | | | |
|---|---|---|---|
| 2016/0366379 A1* | 12/2016 | Hickl | ........................ G09F 9/35 |
| 2017/0102485 A1 | 4/2017 | Ha et al. | |
| 2017/0250329 A1* | 8/2017 | Takeya | .................. H01L 27/124 |
| 2018/0190631 A1 | 7/2018 | Kim et al. | |
| 2018/0227553 A1 | 8/2018 | Hickl | |
| 2019/0049760 A1* | 2/2019 | Hyun | ..................... H05B 47/10 |
| 2019/0115329 A1 | 4/2019 | Min et al. | |

FOREIGN PATENT DOCUMENTS

| | | | |
|---|---|---|---|
| KR | 10-2009-0058984 A | 6/2009 | |
| KR | 10-1157425 B1 | 6/2012 | |
| KR | 10-1614898 B1 | 4/2016 | |
| KR | 10-2017-0012197 A | 2/2017 | |
| KR | 1020170043127 A | 4/2017 | |
| KR | 10-2018-0045527 A | 5/2018 | |
| KR | 1020190046684 A | 5/2019 | |

OTHER PUBLICATIONS

Written Opinion (PCT/ISA/237) dated Sep. 28, 2020 by the International Searching Authority in counterpart International Patent Application No. PCT/KR2020/009233.

Communication dated Apr. 26, 2022, issued by the European Patent Office in counterpart European Application No. 20852844.8.

* cited by examiner

100

DISPLAY APPARATUS AND MANUFACTURING METHOD THEREOF

CROSS-REFERENCE TO RELATED APPLICATION(S)

This application is based on and claims priority under 35 U.S.C. § 119(a) of a Korean Patent Application Number 10-2019-0099103, filed on Aug. 13, 2019 in the Korean Intellectual Property Office, the disclosure of which is incorporated by reference herein in its entirety.

BACKGROUND

1. Field

The disclosure relates to a display apparatus and a manufacturing method thereof, and more particularly, to a display apparatus including a plurality of modular displays and a manufacturing method thereof.

2. Description of Related Art

A light emitting diode (LED) is a semiconductor diode which emits light when a voltage is applied thereto, and is widely used as a light source of not only a general lighting apparatus but also a display apparatus for displaying images. Recently, display apparatuses using micro LEDs (μ-LEDs, μLEDs or uLEDs) as a light source are being developed.

Here, a micro LED may refer to an inorganic light emitting diode of which length, width, and height are respectively in a size of smaller than or equal to 100 micrometers (am). As a micro LED is a subminiature self-emission diode, it can be independently operated as a pixel unit (or a sub pixel unit constituting a pixel) constituting an image.

A micro LED display panel in which micro LEDs are applied as a light source in a flat-panel display, and a micro LED display panel provides better contrast, response time, and energy efficiency compared to a liquid crystal display (LCD) panel which needs a backlight. Both of an organic light emitting diode (OLED) and a micro LED which is an inorganic light emitting diode have good energy efficiency, but a micro LED has better brightness and light emitting efficiency, and a longer lifespan than an OLED.

In addition, a modular method is used as a method of manufacturing a display apparatus in which micro LEDs are installed as a light source. A modular method may refer to a method of manufacturing a display apparatus by manufacturing each of the modular displays in which a plurality of micro LEDs are mounted, and joining the modular displays into the display apparatus.

However, in the case of a modular method, a seam formed between parts of the modular displays, where they are joined together, may be visible to the naked eye of a user. In particular, in case an external light is reflected, the ratio of diffuse reflection becomes higher than that of regular reflection at a seam in a flat modular display area, and therefore, visibility of the seam may exacerbate.

Due to the above-described problem, a user may not recognize that the display apparatus including modular displays is one coherent integrated display, but rather a divided display with a seam as the boundary.

SUMMARY

In accordance with an aspect of the disclosure, there is provided a display apparatus including: a chassis; a plurality of modular displays disposed and tiled on the chassis, each of the plurality of displays including a plurality of light emitting diodes (LEDs) constituting each of a plurality of pixels; and a patterned molding layer formed on the each of the plurality of modular displays, wherein the patterned molding layer is formed to correspond to a boundary line between at least two modular displays adjacent to each other among the plurality of modular displays.

The patterned molding layer includes a plurality of molding-pieces, and the plurality of molding-pieces are arranged to be distanced from one another.

The patterned molding layer includes a groove which is formed between the plurality of molding-pieces, and a width of the groove is equal to a width of the boundary line.

The each of the plurality of modular displays includes a black matrix formed between the plurality of LEDs, and the groove is formed in a location corresponding to the black matrix.

The each of the plurality of molding-pieces is formed in an area corresponding to at least one pixel among the plurality of pixels.

A thickness of the plurality of molding-pieces is greater than or equal to a height of the plurality of LEDs.

The each of the plurality of modular displays is arranged so as to be tiled without a step difference between the plurality of modular displays adjacent to each other.

The plurality of modular displays are arranged on the chassis such that a first interval between a first set of pixels formed in each edge area of a first modular display and a second modular display that are adjacent to each other is equal to a second interval between a second set of pixels adjacent to each other and formed in any one modular display among the plurality of modular displays.

In accordance with an aspect of the disclosure, there is provided a manufacturing method of a display apparatus including a plurality of modular displays, wherein each of the plurality of modular displays includes a plurality of light emitting diodes (LEDs) constituting each of a plurality of pixels. The method includes arranging the plurality of modular displays on a chassis so as to be tiled; and forming a patterned molding layer on the each of the plurality of modular displays, the patterned molding layer corresponding to a boundary line between modular displays adjacent to each other among the plurality of modular displays.

The forming the patterned molding layer further includes forming a molding layer on the plurality of modular displays; and patterning the molding layer such that a plurality of molding-pieces are arranged to be distanced from one another.

The patterning the molding layer further includes patterning the molding layer such that the groove is formed between the plurality of molding-pieces, and a width of the groove is equal to a width of the boundary line.

The each of the plurality of modular displays includes a black matrix formed between the plurality of LEDs, and the patterning the molding layer further includes patterning the molding layer such that the groove is formed in a location corresponding to the black matrix.

The patterning the molding layer further includes patterning the molding layer such that each of the plurality of molding-pieces is formed in an area corresponding to at least one pixel among the plurality of pixels.

The patterning the molding layer further includes patterning the molding layer such that the plurality of molding-pieces are formed to have a thickness greater than or equal to a height of the plurality of LEDs.

The arranging the plurality of modular displays further includes arranging the plurality of modular displays so as to be tiled without a step difference between the plurality of modular displays adjacent to each other.

The arranging the plurality of modular displays further includes arranging the plurality of modular displays on the chassis such that a first interval between a first set of pixels formed in each edge area of a first modular display and a second modular display that are adjacent to each other is equal to a second interval between a second set of pixels adjacent to each other and formed in any one modular display among the plurality of modular displays.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1A:
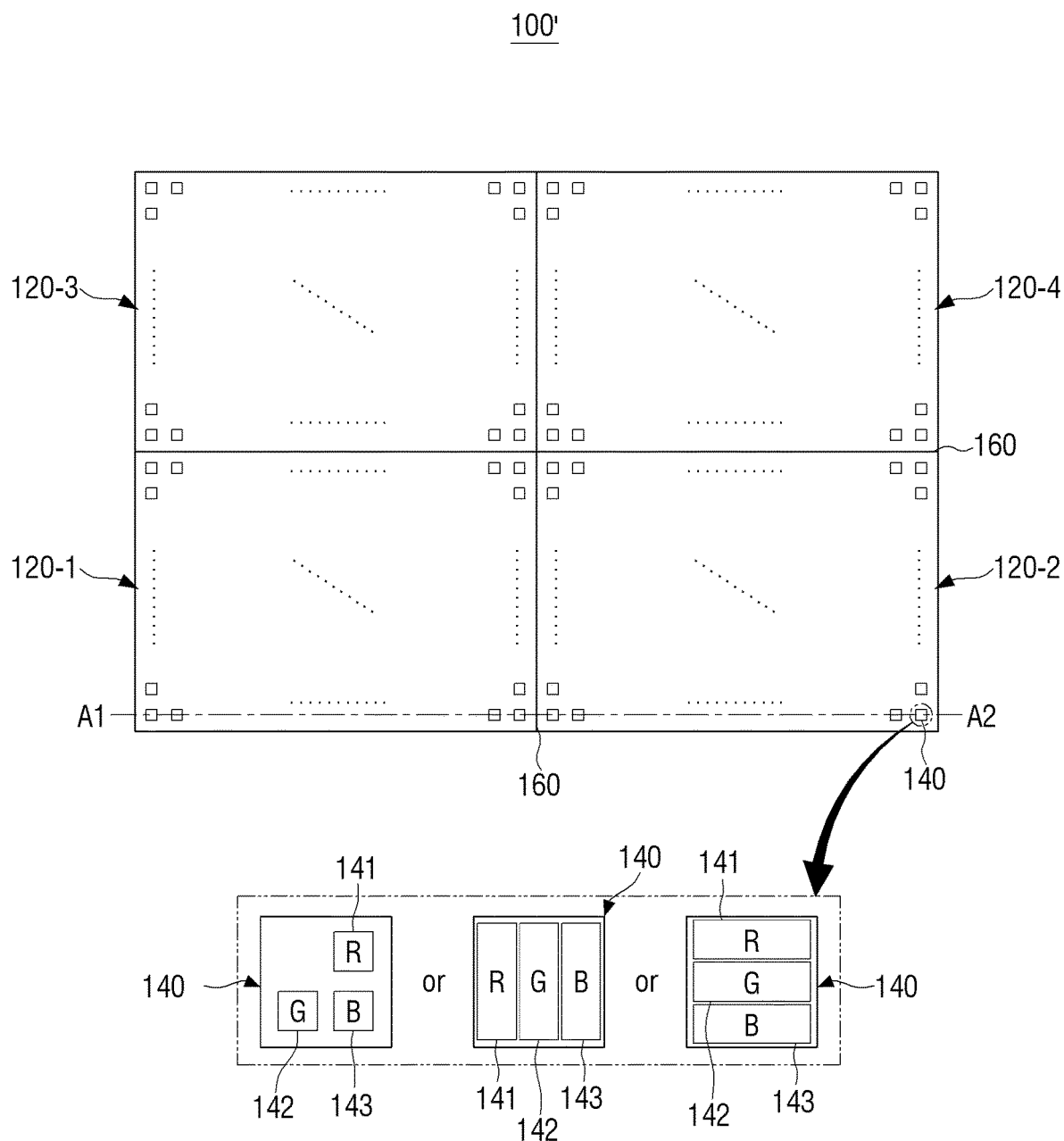
FIG. 1A is a diagram illustrating a display apparatus according to an embodiment.

Hereafter, embodiments of the disclosure will be described with reference to the accompanying drawings.

In the disclosure, in case it is determined that detailed explanation of related known functions or components may unnecessarily confuse the gist of the disclosure, the detailed explanation will be omitted. In addition, the embodiments may be modified in various forms, and the scope of the embodiments of the disclosure is not limited to the embodiments described herein. Rather, these embodiments are provided to make those skilled in the art to understand and to fully convey the technical features of the disclosure.

Also, the various embodiments are not intended to limit the scope of the disclosure, but they should be interpreted to include various modifications, equivalents, and/or alternatives of the embodiments. In addition, with respect to the detailed description of the drawings, similar components may be designated by similar reference numerals.

The expressions "first," "second" and the like used in the disclosure may be used to describe various elements regardless of any order and/or degree of importance. Also, such expressions are used only to distinguish one element from another element, and are not intended to limit the elements.

Also, the expressions "A or B," "at least one of A and/or B," or "one or more of A and/or B" and the like may include all possible combinations of the items listed together. For example, "A or B," "at least one of A and B," or "at least one of A or B" may refer to: (1) including at least one A, (2) including at least one B, or (3) including at least one A and at least one B.

In addition, the expression such as "x-y" may be interpreted to mean "at least one value belonging to a range greater than or equal to x and smaller than or equal to y." (here, x and y are numbers)

Singular expressions may include plural expressions unless clearly indicated otherwise in the context. In addition, terms such as "include" and "comprise" should be construed as designating that there are such characteristics, numbers, steps, operations, elements, components or a combination thereof described in the disclosure, but not as excluding in advance the existence or possibility of adding one or more of other characteristics, numbers, steps, operations, elements, components or a combination thereof.

Also, a phrase such as one element (e.g., a first element) is "(operatively or communicatively) coupled with/to" or "connected to" another element (e.g., a second element) may be interpreted to include the case where the one element is directly coupled to the another element and the case where the one element is coupled to the another element through still another element (e.g., a third element). In contrast, a phrase such as one element (e.g., a first element) is "directly coupled" or "directly connected" to another element (e.g., a second element) may be interpreted to mean that still another element (e.g., a third element) does not exist between the one element and the another element.

In addition, the expression "configured to" may be interchangeably used with other expressions such as "suitable for," "having the capacity to," "designed to," "adapted to," "made to," and "capable of," depending on cases. Here the term "configured to" does not necessarily mean that a device is "specifically designed to" in terms of hardware. Instead, under certain circumstances, the expression "a device configured to" may mean that the device "is capable of" performing an operation together with another device or component. For example, the phrase "a processor configured to perform A, B and C" may mean a dedicated processor (e.g., an embedded processor) for performing the corresponding operations, or a generic-purpose processor (e.g., a central processing unit (CPU) or an application processor) that can perform the corresponding operations by executing one or more software programs stored in a memory device.

Hereinafter, embodiments of the disclosure will be described in detail with reference to the accompanying drawings.

FIGS. 1A to 1D are diagrams for illustrating a display apparatus according to an embodiment.

Figure 1B:
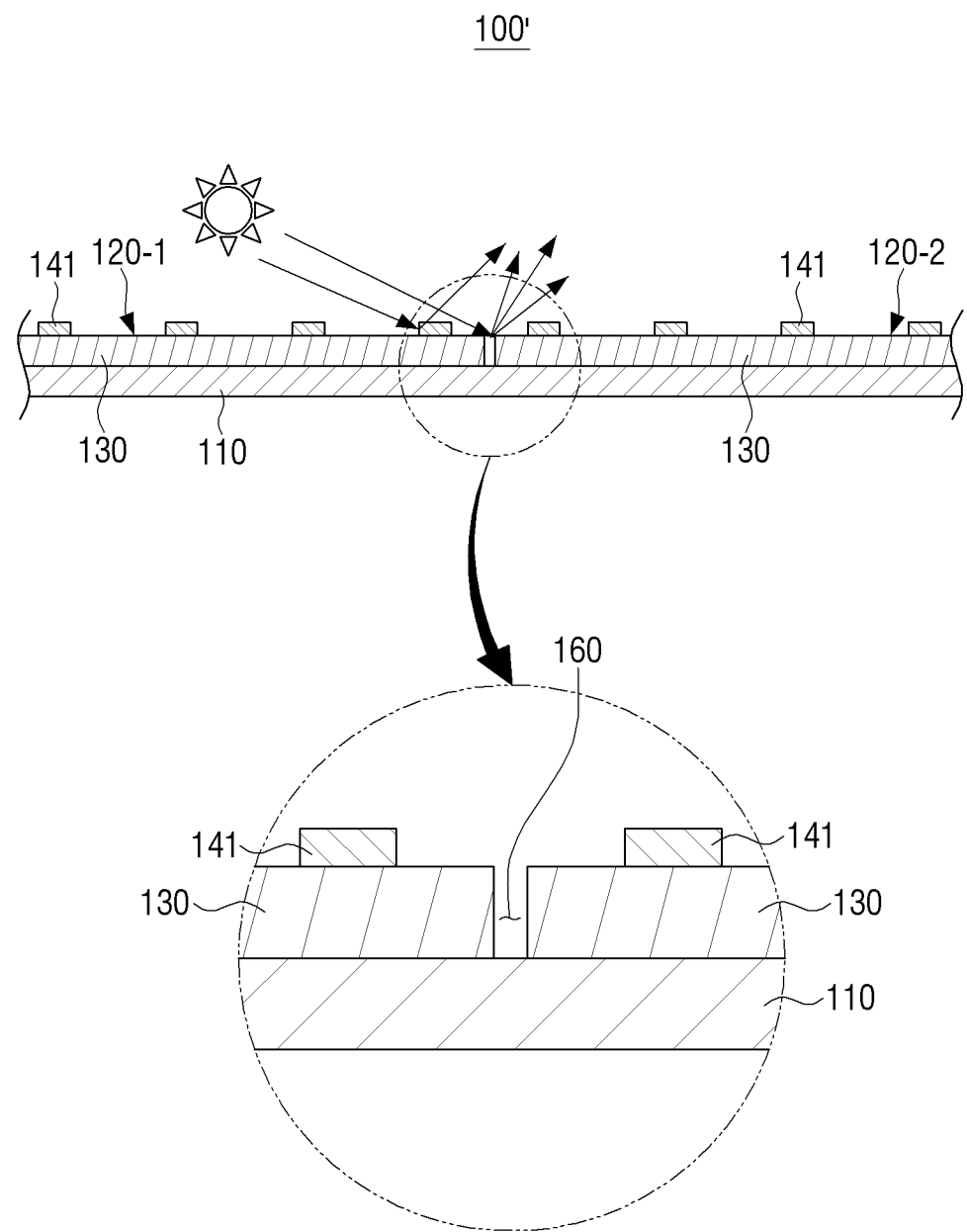
FIG. 1B is a cross-section view of a display apparatus according to an embodiment.

Referring to FIGS. 1A and 1B, a display apparatus 100' may include a chassis 110 and a plurality of modular displays 120-1 to 120-4.

The display apparatus 100' is an apparatus that can process an image signal received from an external or internal storage device, and can visually display the processed image. The display apparatus 100' may be implemented in various forms such as a TV, a monitor, a portable multimedia apparatus, a portable communication apparatus, a smartphone, a smart glass, a smart window, a smart watch, a head mount display (HMD), a wearable apparatus, signage, an electronic board, a billboard, a cinema screen, a video wall, etc. However, the display apparatus is not limited thereto.

The chassis 110 may support the plurality of modular displays 120-1 to 120-4. Specifically, the top part of the chassis 110 may be coupled (or bonded) with the bottom parts of the plurality of modular displays 120-1 to 120-4 arranged to be mutually tiled on the top part of the chassis 110. The chassis 110 may be implemented as a metal material such as aluminum or rubber, or a flexible material such as polyimide, etc. As described above, the chassis 110 may maintain the arrangement form of the plurality of modular displays 120-1 to 120-4 and protect the plurality of modular displays 120-1 to 120-4 from the outside environment.

The plurality of modular displays 120-1 to 120-4 may respectively include a plurality of pixels. Also, the plurality of modular displays 120-1 to 120-4 may be arranged to be mutually tiled on the chassis 110. In other words, the plurality of modular displays 120-1 to 120-4 may be tiled mutually on the chassis 110. In this case, the plurality of modular displays 120-1 to 120-4 may be supported by the chassis 110.

Specifically, tiling may refer to arranging the modular displays on the chassis 110 periodically and repeatedly such that the modular displays do not overlap. That is, the plurality of modular displays 120-1 to 120-4 may be arranged on the chassis 110 such that they do not overlap with one another. Here, the plurality of modular displays 120-1 to 120-4 may be arranged to be distanced from one another on the chassis 110. Also, the plurality of modular displays 120-1 to 120-4 may be distanced by a predetermined interval.

For example, the plurality of modular displays 120-1 to 120-4 may be arranged in the form of a matrix (e.g., M×N, where M and N are natural numbers) on the chassis 110. As an example, the plurality of modular displays 120-1 to 120-4 may be arranged in rows and columns in the same numbers as one another (e.g., in the case of M=N, a 3×3 arrangement, a 5×5 arrangement, etc., where M and N are natural numbers). As another example, the plurality of modular displays 120-1 to 120-4 may be arranged in rows and columns in different numbers from one another (e.g., in the case of M a 3×2 arrangement, a 5×4 arrangement, etc., where M and N are natural numbers). Hereinafter, for the convenience of explanation, explanation will be made based on the assumption that the plurality of modular displays 120-1 to 120-4 are arranged in an arrangement of 2×2.

Each of the plurality of modular displays 120-1 to 120-4 may be arranged in a specific location in the top part of the chassis 110 according to the arrangement form, and afterwards, the bottom parts of the plurality of modular displays 120-1 to 120-4 may be coupled (or bonded) with the top part of the chassis 110. In FIG. 1A, it is illustrated that the number of the plurality of modular displays 120-1 to 120-4 is four, but this is just for the convenience of explanation, and the number of the plurality of modular displays 120-1 to 120-4 may be modified variously.

Also, the plurality of modular displays 120-1 to 120-4 may respectively include a plurality of pixels. Specifically, each of the plurality of modular displays 120-1 to 120-4 may include a plurality of pixels 140 corresponding to an area of an image. That is, the plurality of modular displays 120-1 to 120-4 may display the entire area of an image as one display. Here, a pixel 140 is a unit constituting an image, and each pixel may independently express brightness and a color. Meanwhile, unless specifically indicated otherwise, the first modular display 120-1 can be applied in the same manner to other modular displays 120-2, 120-3, 120-4 constituting the display apparatus 100'. Hereinafter, for the convenience of explanation, in the case of referring to a single modular display among the plurality of modular displays 120-1 to 120-4, explanation will be made based on the first modular display 120-1.

As shown in FIGS. 1A and 1B, the modular display 120-1 may include a substrate 130 and a plurality of LEDs 141 to 143.

The substrate 130 may refer to a plate that fixes electronic devices formed inside the substrate 130 or on a surface of the substrate 130, and connects each electronic device therein to constitute an electronic circuit. The substrate 130 may be implemented in the form of a plate in which the height is shorter than the length or the width of the substrate, and may be implemented with a material having various properties such as a transparent property or a bending property. For example, the substrate 130 may be implemented as a thin film layer consisting of multiple layers which include polyimide (PI), PET, metal foil, PVC, PMMA, etc.

Also, the substrate 130 may include a driving circuit for driving the plurality of LEDs 141 to 143 and an electrode for transmitting the signal of the driving circuit to the plurality of LEDs 141 to 143. Here, the substrate 130 may electronically connect the driving circuit and the plurality of LEDs 141 to 143 through the electrode.

Here, the driving circuit may include a plurality of switching elements for selectively transmitting driving signals controlling each of the plurality of LEDs 141 to 143. Here, the switching elements may be implemented as, for example, a thin film transistor (TFT). A TFT (or a backplane) is not limited to a specific structure or type. That is, a TFT may be implemented as a low-temperature polycrystalline silicon (LTPS) TFT, an oxide TFT, a poly silicon TFT, an amorphous silicon (a-silicon) TFT, an organic TFT, a graphene TFT, etc. Also, it may be implemented as various types such as a P type (or an N-type) MOSFET formed in an Si wafer CMOS process, etc.

Each of the plurality of LEDs 141 to 143 may emit a light, and the pixel 140 may be constituted by combining the lights emitted from the plurality of LEDs 141 to 143.

Here, each of the plurality of LEDs 141 to 143 may be implemented as a semiconductor light emitting diode. For example, the LED 141 may be implemented as a micro-LED or a mini-LED based on an inorganic semiconductor. Here, a micro-LED may refer to a semiconductor light emitting diode of which length, width, and height are respectively in a size of about 1 to 100 micrometers (am). A mini-LED may refer to a semiconductor light emitting diode of which length, width, and height are respectively in a size of about 100 to 200 micrometers (am).

Also, each of the plurality of LEDs 141 to 143 may emit a light expressing a color among three primary colors (red, green, blue). For example, the first LED 141 may emit a light of a red (R) color, the second LED 142 may emit a light of a green (G) color, and the third LED 143 may emit a light of a blue (B) color. Furthermore, the first LED 141 may include at least one semiconductor layer based on an AlInGaP-based semiconductor for emitting a red light at a wavelength of 600-750 nm. Also, the second LED 142 and the third LED 143 may each include at least one semiconductor layer based on an AlInGaN-based semiconductor for respectively emitting a green light at a wavelength of 500-570 nm and a blue light at a wavelength of 450-490 nm.

As an example, in the part that enlarged the pixel 140 in FIG. 1A, a method of arranging the plurality of LEDs 141 to 143 (i.e., sub pixels) constituting the pixel 140 is illustrated. However, the disclosure is not limited thereto, and the number, arrangement, structure, colors, etc. of the LEDs may be changed variously according to layouts in various forms such as a diamond form, a delta form, a stripe form, an RGBW form, an RGBY form, a pentile form, a quad form, a mosaic form, etc.

A case in which an external light (e.g., a natural light, indoor lighting, etc.) is introduced into the display apparatus 100' will be described with reference to FIG. 1B. FIG. 1B is a cross sectional view of the display apparatus 100' taken along the line A1-A2 in FIG. 1A.

Referring to FIG. 1B, the display apparatus 100' may have a structure in which the plurality of modular displays 120-1 to 120-4 are arranged to be distanced from one another on the chassis 110.

That is, between the plurality of modular displays 120-1 to 120-4, a seam 160 may be formed. Here, the seam 160 may refer to a boundary line (or a space) between modular displays adjacent to each other that is formed when the plurality of modular displays 120-1 to 120-4 arranged on the chassis 110 are distanced from one another. For example, the modular displays adjacent to each other may refer to the first modular display 120-1 and the second modular display 120-2, the first modular display 120-1 and the third modular display 120-3, the second modular display 120-2 and the fourth modular display 120-4, and the third modular display 120-3 and the fourth modular display 120-4. Hereinafter, for the convenience of explanation, explanation will be made based on the assumption that the modular displays adjacent to each other 120-1, 120-2 are the first modular display 120-1 and the second modular display 120-2.

The seam 160 may be visually recognized as the boundary line between the modular displays adjacent to each other 120-1, 120-2 to a user. For example, as there is a difference in the refractive indices (or light density) between the seam 160 and an adjacent point (e.g., the edge portions of the plurality of modular displays 120-1 to 120-4), and diffuse reflection occurs in the edge portions where the inclination angles of the surfaces of the plurality of modular displays 120-1 to 120-4 drastically change. Therefore, the seam 160 may be visually recognized by the naked eye of a user. In particular, in case the seam 160 is included in an area where the contrast of an image is low (a dark portion), visibility of the seam 160 may be further increased. Accordingly, the immersion level of a user viewing the display apparatus 100' may be reduced.

Figure 1C:
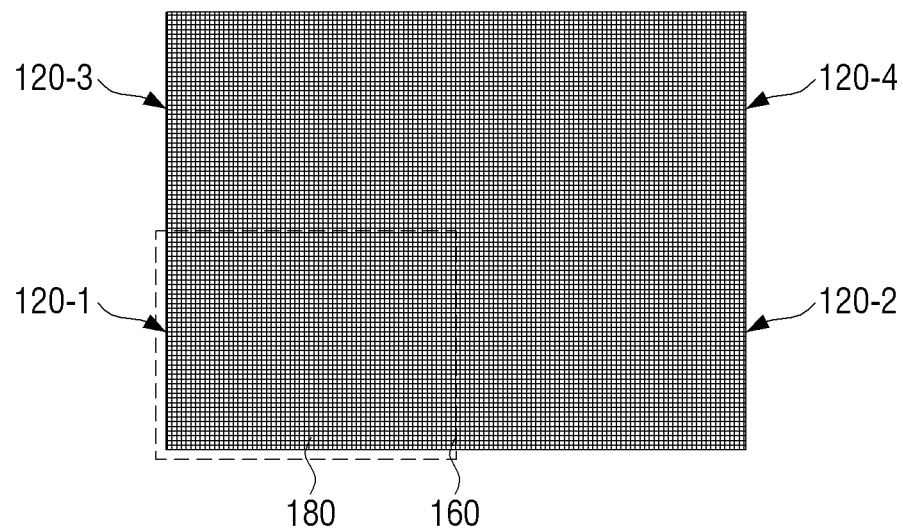
FIG. 1C is a diagram illustrating grooves and seams in a display apparatus according to an embodiment.
Figure 1D:
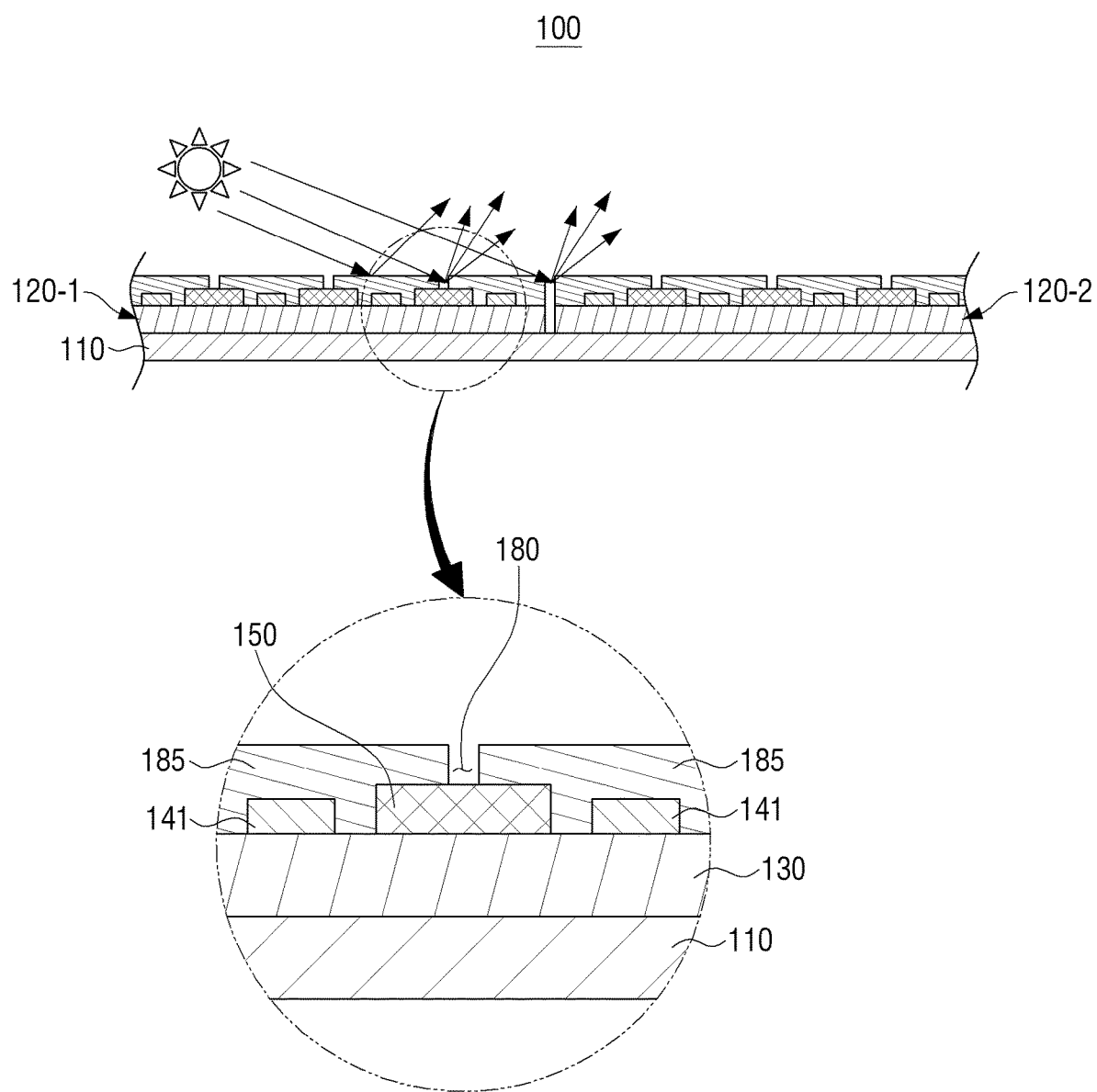
FIG. 1D is a cross sectional view of a display apparatus including a patterned molding layer according to an embodiment.
Figure 2:
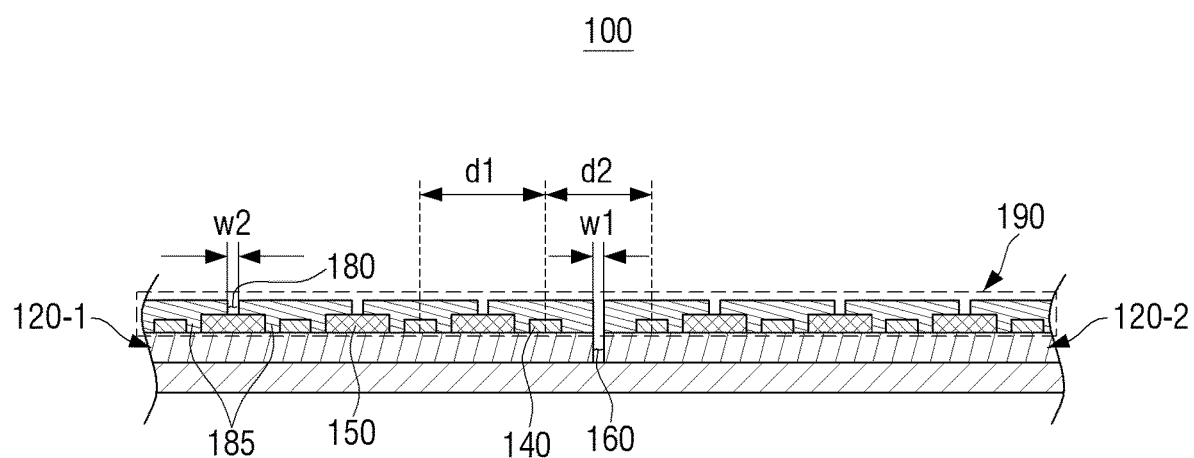
FIG. 2 is a diagram illustrating a patterned molding layer according to an embodiment.

To prevent this problem, the display apparatus 100 according to an embodiment may include a patterned molding layer 190 (refer to FIG. 2). Hereinafter, the display apparatus 100 including the patterned molding layer 190 will be described with reference to FIG. 1C and FIG. 1D. FIG. 1D is a cross-sectional view for the modular displays adjacent to each other 120-1, 120-2 in the display apparatus 100 illustrated in FIG. 1C.

Referring to FIG. 1C and FIG. 1D, the display apparatus 100 may include the chassis 110, the plurality of modular displays 120-1 to 120-4, and the patterned molding layer 190. Here, the chassis 110 and the plurality of modular displays 120-1 to 120-4 have been described above, and the aforementioned description can be applied in the same way to the components. Thus, overlapping description will be omitted.

The patterned molding layer 190 may be formed on the plurality of modular displays 120-1 to 120-4. The patterned molding layer 190 may form boundary lines like the seam 160 uniformly at narrower intervals, and thereby making the display recognized as an integrated body. At the same time, it may be used to protect the LED 141 by blocking the LED 141 from being exposed to the outside.

Here, the patterned molding layer 190 may refer to a molding layer that is formed as a structure including a portion where a layer formed in a height direction is not continued in a direction perpendicular to the height direction (i.e., inside the plane) (hereinafter, referred to as a groove 180) and a portion where the layer is continued in the direction perpendicular to the height direction (hereinafter, referred to as a molding-piece 185). In other words, the patterned molding layer 190 may include a plurality of molding-pieces 185 formed on the substrate 130, and the plurality of molding-pieces 185 are spaced apart so that the grooves 180 are formed between the plurality of molding-pieces 185. Here, the molding layer may include various materials such as resins like silicon and epoxy. Furthermore, the groove 180 may be a space filled with a material different from the material of molding-pieces 185.

In this case, the patterned molding layer 190 may be formed to correspond to the boundary line between the modular displays adjacent to each other 120-1, 120-2 among the plurality of modular displays 120-1 to 120-4.

Specifically, the patterned molding layer 190 may have a structure where molding lines are formed on the surface. In this case, the molding lines may correspond to the boundary line between the modular displays adjacent to each other 120-1, 120-2. For example, in case the plurality of molding-pieces 185 included in the patterned molding layer 190 are distanced from one another (i.e., in case the groove 180 is linear) as in FIG. 1D, diffuse reflection of an external light occurs in the edge portion of the groove 180 or the molding-pieces 185, and thus the component may be recognized as a line to a user. This is because there is a difference in the refractive indices (or light density) in adjacent portions such as the groove 180 and the molding-pieces 185, and the surface angles drastically change in the edge portions of the molding-pieces 185, and thus diffuse reflection occurs.

Here, molding lines may be formed to be in parallel with the boundary line of the modular displays 120-1 and 120-2 adjacent to each other. If the boundary line extend in one direction, the molding lines in parallel with the boundary line may be formed at regular interval in another direction perpendicular to the one direction. That is, the intervals among the plurality of molding lines in parallel with the boundary line may be regular. Also, in case there is a first boundary line in one direction and a second boundary line in another direction perpendicular to the one direction between the modular displays adjacent to each other, for example, modular displays 120-1 and 120-2 and modular displays 120-1 and 120-3, the plurality of molding lines in parallel with the first and second boundary lines may be formed in a structure where they are perpendicular to one another (or a grid structure). In this case, the intervals among the plurality of molding lines in parallel with each boundary line may be regular.

As in FIG. 1C, the molding lines that are in parallel with the boundary line of the seam 160 and are repetitively formed at uniform intervals may generate optical illusion such that a user cannot distinguish between the boundary line of the seam 160 and the molding lines. Accordingly, the sense of integration and the immersion level of a user for the display apparatus 100 can be improved.

Also, the patterned molding layer 190 formed on the plurality of LEDs 141 to 143 protects the plurality of LEDs 141 to 143 from the external environment, and accordingly, a display apparatus 100 having improved protection and durability can be provided.

Hereinafter, the display apparatus 100 according to an embodiment will be described in detail with reference to FIGS. 2 to 4B.

The plurality of modular displays 120-1 to 120-4 may be arranged to be mutually tiled on the chassis 110. For example, the plurality of modular displays 120-1 to 120-4 may be arranged to be distanced from one another at regular intervals on the chassis 110. In this case, the plurality of modular displays 120-1 to 120-4 may be supported together by the chassis 110. Hereinafter, it will be assumed that the plurality of modular displays 120-1 to 120-4 are arranged in an arrangement as illustrated in FIG. 1A and FIG. 1C.

Here, each of the plurality of modular displays 120-1 to 120-4 may be arranged to be tiled without a step difference between the modular displays 120-1 and 120-2 that are adjacent to each other. The step difference may refer to a difference in the height or the thickness, and the description 'without a difference' may include not only a case where a step difference is 0 in which the modular displays adjacent to each other may appear as a plane visually but also a case where a step difference is within a range of smaller than or equal to a predetermined value.

Referring to FIG. 2, the plurality of modular displays 120-1 to 120-4 may be arranged on the chassis 110 such that the interval between the pixels 140 formed in each edge area of the modular displays 120-1 and 120-2 is d2 and the interval between the pixels 140 formed in any one modular display is d1.

Specifically, the modular displays adjacent to each other among the plurality of modular displays 120-1 to 120-4 may include, for example, the first and second modular displays 120-1, 120-2, the first and third modular displays 120-1, 120-3, the second and fourth modular displays 120-2, 120-4, and the third and fourth modular displays 120-3, 120-4 in the arrangements in FIG. 1A and FIG. 1C.

The interval between the pixels 140 formed in the any one modular display 120-1 may refer to a first center distance d1 between the most adjacent (the closest) two pixels among the plurality of pixels formed in the first modular display 120-1. That is, the most adjacent two pixels may refer to two pixels where other pixels do not exist in between them.

The interval between the pixels 140 formed in each edge area of the modular displays 120-1 and 120-2 may refer to a second center distance d2 between the pixel formed in the edge area of the first modular display 120-1 and the pixel formed in the edge area of the second modular display 120-2. Here, the pixels formed in the edge areas of the first and second modular displays 120-1 and 120-2 adjacent to each other may refer to two pixels where the seam 160 exists between them among the pixels arranged to be closest to the edges of the first and second modular displays 120-1, 120-2.

As the intervals between the plurality of pixels formed in the display apparatus 100 are maintained to be regular as described above, degradation of the image quality and the sense of difference recognized by a naked eye can be minimized.

A modular display according to an embodiment may be installed on wearable devices, portable devices, handheld devices and various kinds of electronic products or electronic components which need displays in a single unit. Also, a modular display may be installed in display devices such as monitors for personal computers (PCs), mobile phones, high resolution TVs and signage, electronic boards, etc. in plural units (a matrix type, etc.) through assembly arrangement.

As described above, the patterned molding layer 190 may be formed on the plurality of modular displays 120-1 to 120-4.

Here, the patterned molding layer 190 may include a plurality of molding-pieces 185, and the plurality of molding-pieces 185 may be arranged to be distanced from one another from the boundary line between the modular displays 120-1 and 120-2 that are separated and adjacent to each other among the plurality of modular displays 120-1 to 120-4.

Specifically, the plurality of molding-pieces 185 may be formed on the plurality of modular displays 120-1 to 120-4, and the molding-pieces of the plurality of molding-pieces 185 may be arranged to be distanced from one another so that they are not located on the boundary line between the modular displays 120-1 and 120-2 that are adjacent to each other.

In this case, an interval w1 may be a distance in which the plurality of molding-pieces 185 are distanced (also corresponds to the width of the seam 160) between the modular displays 120-1 and 120-2 adjacent to each other. An interval w2 may be a distance between the plurality of molding-pieces 185 formed on any one modular display (e.g., the first modular display 120-1). Here, the interval w1 and the interval w2 may be the same. The meaning of being the same may include not only a case wherein the two values are completely identical but also a case where the two values are within a predetermined error range. Here, a predetermined error range may be a value set in consideration of an error in the design or the procedure. Meanwhile, an interval by which the plurality of molding-pieces 185 are distanced may be the same concept as the width of the groove 180.

Furthermore, the patterned molding layer 190 may include grooves 180 formed in locations corresponding to the boundary line between the modular displays adjacent to each other. For example, the grooves 180 may be formed at regular intervals in locations corresponding to the boundary line between the modular displays 120-1 and 120-2 that are adjacent to each other. That is, the grooves 180 may be formed at regular intervals in locations corresponding to the boundary line between the modular displays adjacent to each other.

Specifically, the grooves 180 may be formed between the plurality of pixels 140, and formed per regular interval based on one direction. Here, the grooves 180 may be formed to be in parallel with the boundary line between the modular displays 120-1 and 120-2 that are adjacent to each other.

Here, the width of the grooves 180 may be the same as the interval by which the modular displays adjacent to each other are distanced. That is, the width of the grooves 180 may be the same as the width of the seam 160.

As the intervals between the plurality of molding-pieces 185 formed in the display apparatus 100 are maintained to be regular as described above, visibility of a seam area can be reduced.

In FIG. 1D and FIG. 2, each of the plurality of modular displays 120-1 to 120-4 according to an embodiment may include a black matrix 150 formed between the plurality of LEDs 141 to 143. In this case, the grooves 180 may be formed at locations corresponding to the black matrix 150.

Specifically, the black matrix BM may absorb an external light. The black matrix 150 may be formed at a predetermined width and thickness between the plurality of LEDs 141 to 143. However, this is merely an example, and the black matrix 150 may be formed between the plurality of pixels 140 in any other manner. Also, the black matrix 150 may be formed with a photosensitive resin composition or a resin composition including a black pigment for shielding. Here, the black matrix 150 may further include an antistatic agent for preventing occurrence of electro-static discharge (ESD).

In this case, the plurality of molding-pieces 185 may be formed on the plurality of LEDs 141 to 143 and the black matrix 150 formed between the plurality of LEDs 141 to 143. For example, the plurality of molding-pieces 185 are formed to cover the entire top parts of the plurality of LEDs 141 to 143 for protecting the plurality of LEDs 141 to 143 from the external environment, and may be formed to be distanced from one another so that some areas among the top part areas of the black matrix 150 are exposed. As described above, for exposing some areas of the top part areas of the black matrix 150, the grooves 180 may have a thickness h4 corresponding to the difference between a thickness h2 of the plurality of molding-pieces 185 and a thickness h3 of the black matrix 150, as in FIG. 3A and FIG. 3B.

According to an embodiment, the plurality of molding-pieces 185 may be formed in a thickness greater than or equal to the height of the plurality of LEDs 141 to 143. For example, the thickness of the plurality of molding-pieces 185 may be determined based on the height of the plurality of LEDs 141 to 143. Hereinafter, explanation will be made based on the first LED 141 among the plurality of LEDs 141 to 143 with reference to FIG. 3A and FIG. 3B, and it will be assumed that an irradiation angle of light L1 is greater than an irradiation angle of light L2. Here, the irradiation angle may refer to an angle of a light measured based on the surface of the first LED 141, and may refer to a starting point of an arrow illustrated in FIG. 3A and FIG. 3B.

The height of the plurality of LEDs 141 to 143 may be a predetermined value h1. However, this is merely an example, and the plurality of LEDs 141 to 143 may have different values from one another according to colors and structures, etc. Hereinafter, explanation will be made based on the assumption that the height of the plurality of LEDs 141 to 143 are height h1.

The thickness h2 of the plurality of molding-pieces 185 may be greater than the height h1 of the plurality of LEDs 141 to 143, but may be less than or equal to a predetermined value. For example, the thickness h2 of the plurality of molding-pieces 185 may be a value within a range of 1.5 to 4 times of the height h1 of the plurality of LEDs 141 to 143.

Figure 3A:
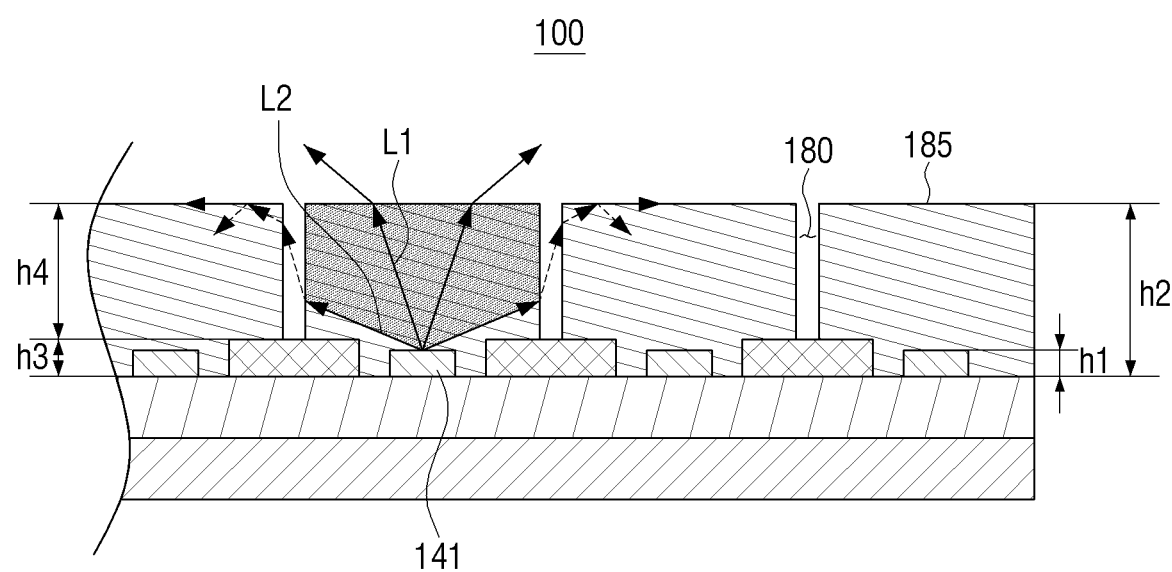
FIG. 3A is a diagram illustrating a patterned molding layer and light refraction according to an embodiment.
Figure 3B:
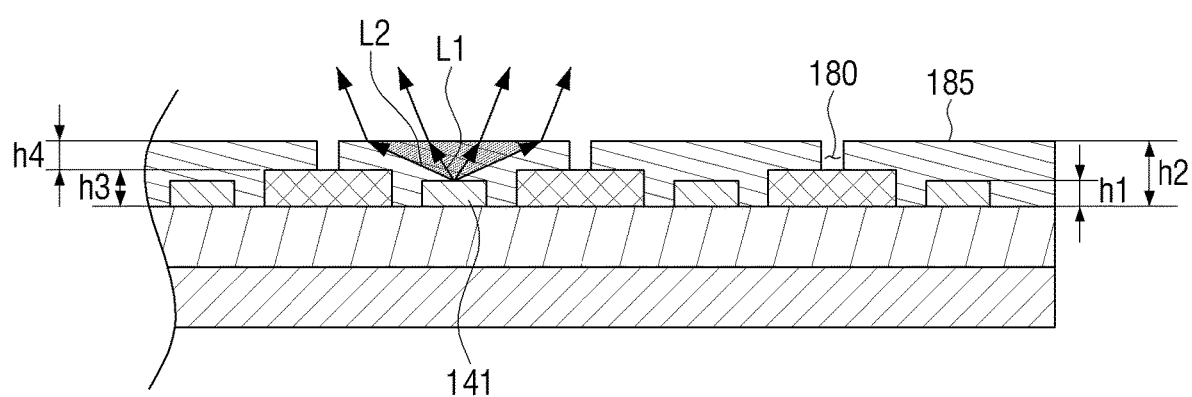
FIG. 3B is a diagram illustrating a patterned molding layer according to an embodiment.

This is in consideration of the feature that, if a case where the thickness h2 of the plurality of molding-pieces 185 is a larger value than h1 as in FIG. 3A is assumed, the light L2 smaller than the irradiation angle of the light L1 proceeds to the side surface of the molding-piece 185 and the rate of a light extracted to the outside by another adjacent molding-piece 185 may be reduced, and in case the thickness h2 of the plurality of molding-pieces 185 is lower than h1 as in FIG. 3B, the rate of a light proceeded to the top surface of the molding-piece 185 and emitted to the outside may be improved.

For example, the predetermined value may be set as $h1+d1*\tan(L2)=h2$. Here, L2 may be an irradiation angle by which a light may be extracted to the outside (e.g., 45 degrees), h1 may be the height of the plurality of LEDs 141 to 143 (e.g., 50 um), and d1 may be the center distance between pixels (e.g., 400 um). Accordingly, the thickness h2 of the plurality of molding-pieces 185 may be a value greater than or equal to 50 um and smaller than or equal to 450 um.

As described above, in the display apparatus 100 according to an embodiment, the rate of a light emitted to the outside may be improved.

Figure 4A:
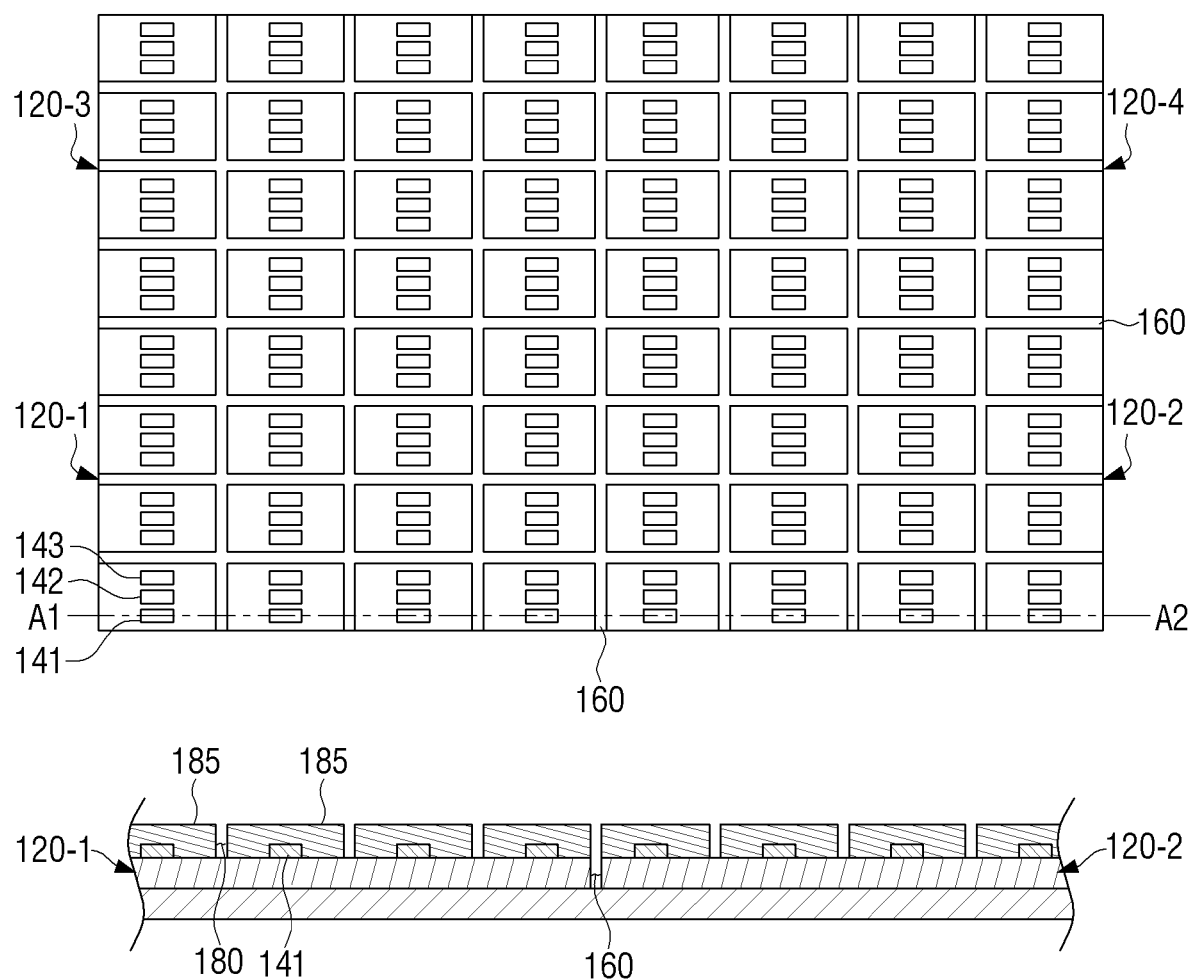
FIG. 4A is a diagram illustrating a patterned molding layer with respect to a display apparatus according to an embodiment.
Figure 4B:
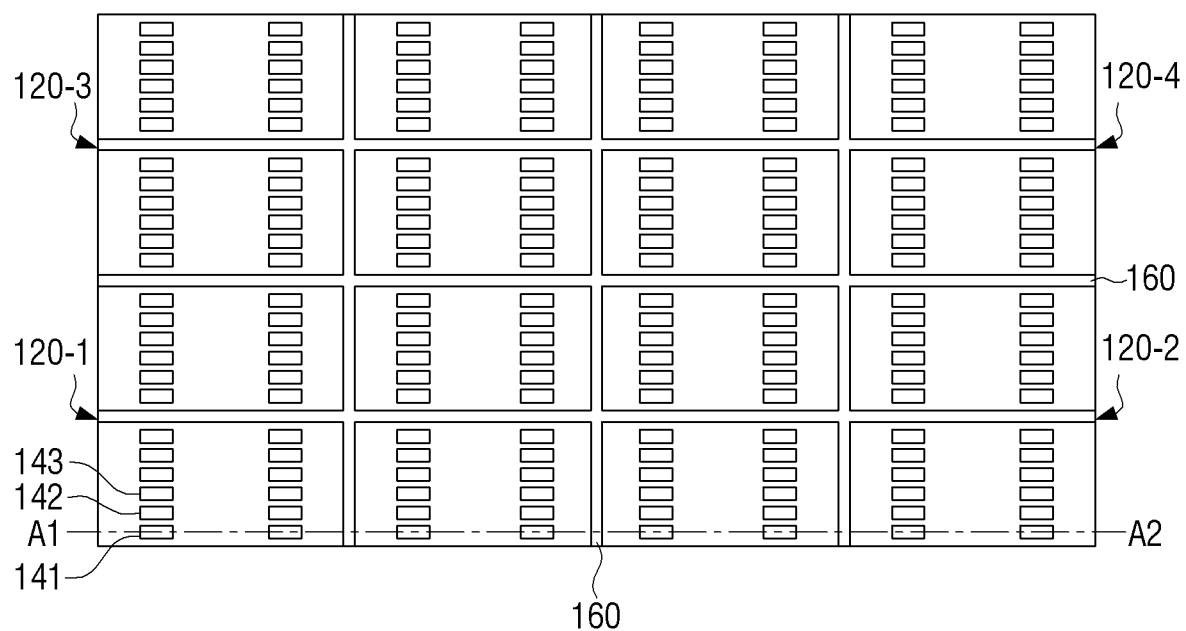
FIG. 4B is a diagram illustrating a patterned molding layer with respect to a display apparatus according to an embodiment.
Figure 4B:
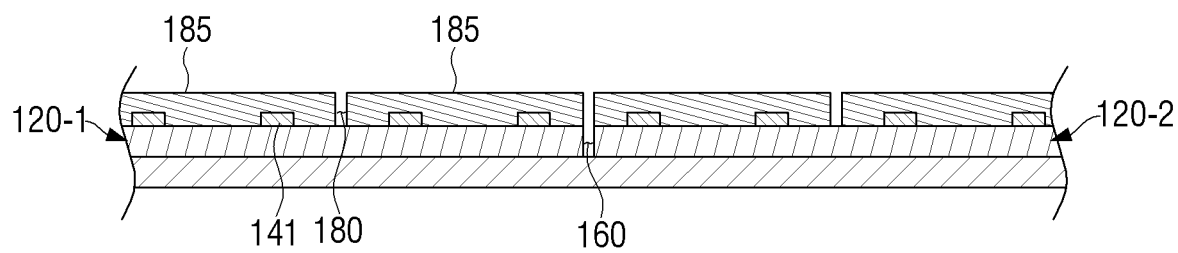

Referring to FIG. 4A and FIG. 4B, the plurality of molding-pieces 185 may be arranged to be distanced from one another in the form of a matrix on the plurality of modular displays 120-1 to 120-4. In this case, each of the plurality of molding-pieces 185 may have the same size with each other.

Specifically, a matrix form may refer to a form where the plurality of molding-pieces 185 have rows and columns in the same numbers as one another (e.g., in the case of M=N, a 3×3 arrangement, a 5×5 arrangement, etc., here, M and N are natural numbers) or a form where the plurality of molding-pieces 185 have rows and columns in different numbers from one another (e.g., in the case of M N, a 3×2 arrangement, a 5×4 arrangement, etc., here, M and N are natural numbers). However, this is merely an example, and the plurality of molding-pieces 185 may be formed on the plurality of modular displays 120-1 to 120-4 such that they are arranged according to the arrangement form where the plurality of pixels 140 are arranged.

Each of the plurality of molding-pieces 185 may be formed in an area corresponding to at least one pixel among the plurality of pixels 140. Here, an area corresponding to at least one pixel among the plurality of pixels 140 may refer to an area where the entire pixels 140 arranged in the modular display 120-1 are divided uniformly by the number of at least one pixel.

Referring to FIG. 4A as an example, each molding-piece 185 may be formed in an area including the plurality of LEDs 141 to 143 constituting one pixel (or a pixel of 1×1). As another example, referring to FIG. 4B, each molding-piece 185 may be formed in an area including four pixels (or pixels of 2×2). That is, each molding-piece 185 may be formed in a pixel unit of n×n (where, n is a natural number).

Figure 5:
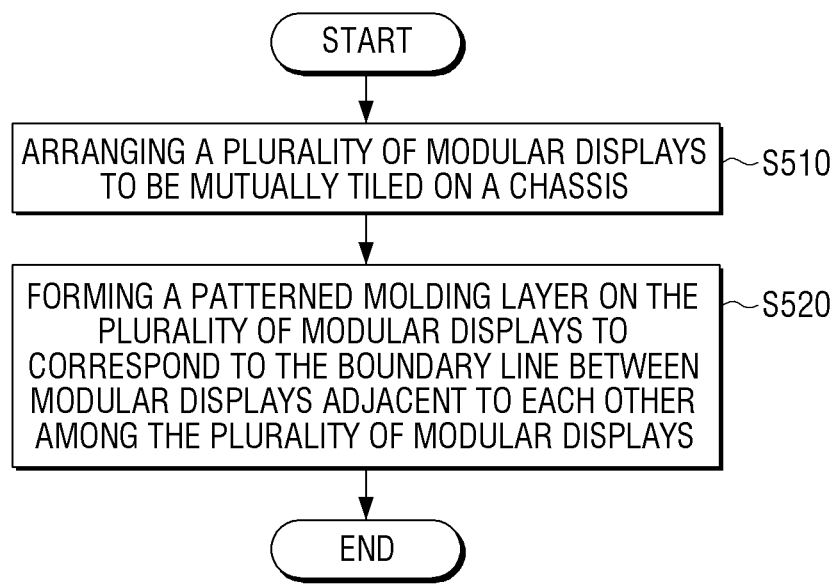
FIG. 5 is a flowchart illustrating a method of manufacturing a display apparatus according to an embodiment.

FIG. 5 is a flowchart illustrating a method of manufacturing a display apparatus according to an embodiment. Hereinafter, explanation will be made with reference to FIGS. 6A to 8 together.

Referring to FIG. 5, a manufacturing method of the display apparatus 100 according to an embodiment includes an operation S510 of arranging a plurality of modular displays 120-1 to 120-4 on the chassis 110 to be mutually tiled and an operation S520 of forming a patterned molding layer 190 on the plurality of modular displays 120-1 to 120-4 to correspond to the boundary lines between modular displays 120-1 and 120-2 adjacent to each other among the plurality of modular displays 120-1 to 120-4.

Figure 6A:
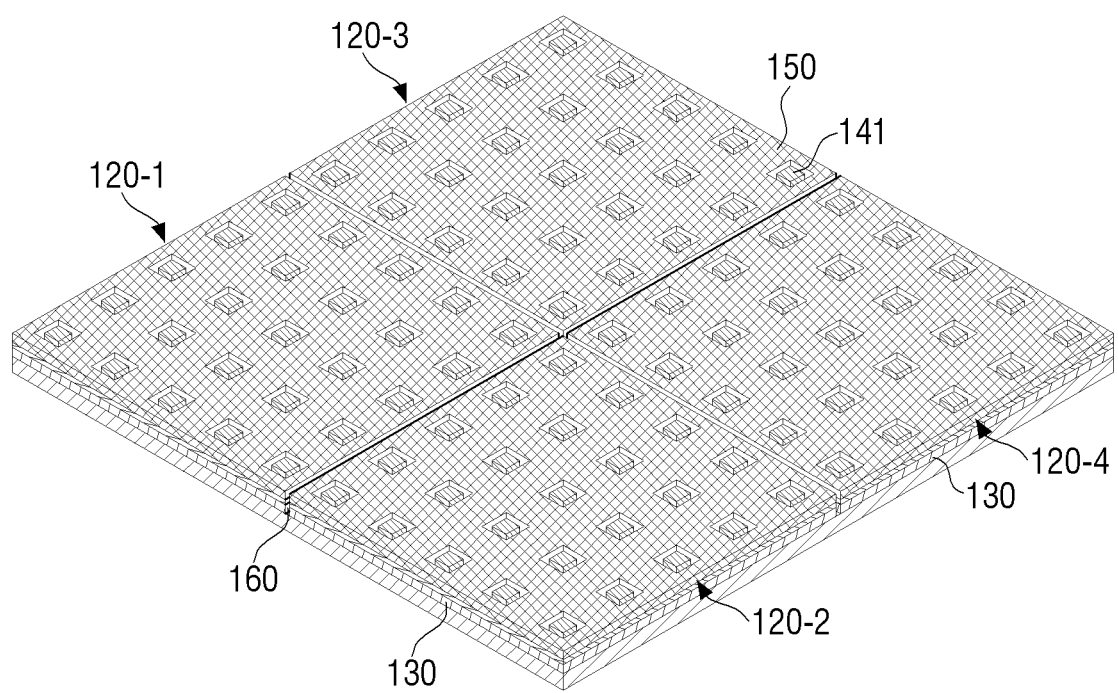
FIG. 6A is a perspective view of a display apparatus according to an embodiment.
Figure 6B:
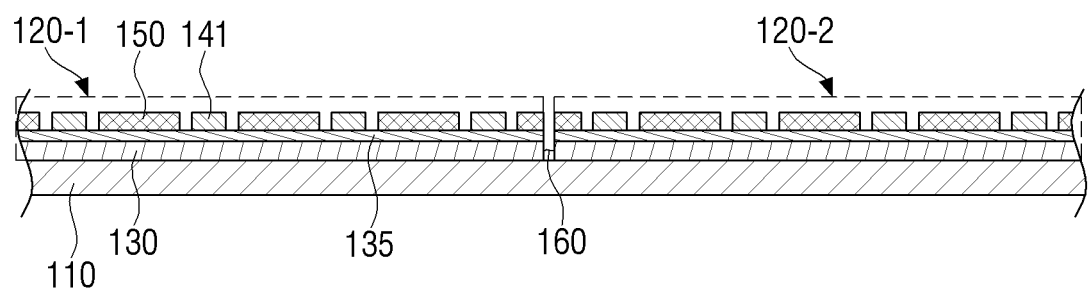
FIG. 6B is a diagram for illustrating a method of manufacturing a display apparatus according to an embodiment.

First, referring to FIG. 6A and FIG. 6B, the plurality of modular displays 120-1 to 120-4 may be arranged to be mutually tiled on the chassis 110 at operation S510. Here, the chassis 110 may support the plurality of modular displays 120-1 to 120-4. The plurality of modular displays 120-1 to 120-4 may respectively include pixels 140 respectively including LEDs 141 to 143. Also, tiling may mean locating the modular displays such that they do not overlap on the same plane. Detailed explanation in this regard will be omitted as it will overlap with the aforementioned content.

Specifically, the plurality of modular displays 120-1 to 120-4 may be arranged in the form of a matrix (e.g., M×N, where, M and N are natural numbers) on the chassis 110. As an example, the plurality of modular displays 120-1 to 120-4 may be arranged in rows and columns in the same numbers as one another (e.g., in the case of M=N, a 3×3 arrangement, a 5×5 arrangement, etc., where, M and N are natural numbers). As another example, the plurality of modular displays 120-1 to 120-4 may be arranged in rows and columns in different numbers from one another (e.g., in the case of M a 3×2 arrangement, a 5×4 arrangement, etc., here, M and N are natural numbers). Hereinafter, for the convenience of explanation, explanation will be made based on the assumption that the plurality of modular displays 120-1 to 120-4 are arranged in an arrangement of 2×2.

Here, at the operation of arranging the plurality of modular displays 120-1 to 120-4, the plurality of modular displays 120-1 to 120-4 may be arranged to be tiled such that there is no step difference between the modular displays 120-1 and 120-2 adjacent to each other. Here, the step difference means a difference in the height or the thickness, and the description 'without a difference' may include not only a case where a step difference is 0 so that the modular displays adjacent to each other may appear as a plane visually, but also a case where a step difference is within a range of smaller than or equal to a predetermined value.

Here, at the operation of arranging the plurality of modular displays 120-1 to 120-4, the plurality of modular displays 120-1 to 120-4 may be arranged on the chassis 110 such that the interval between the pixels formed in each edge area of the modular displays adjacent to each other 120-1, 120-2 and the interval between the pixels formed in any one modular display 120-1 between the modular displays adjacent to each other 120-1, 120-2 are the same. Here, the meaning of being the same may include not only a case where the two values are completely identical but also a case where the two values are within a predetermined error range.

Specifically, the interval between the pixels 140 formed in the any one modular display 120-1 may refer to the center distance d1 between the most adjacent (the closest) two pixels among the plurality of pixels formed in the first modular display 120-1. That is, the most adjacent two pixels may refer to two pixels wherein other pixels do not exist between them. Also, the interval between the pixels 140 formed in each edge area of the modular displays adjacent to each other 120-1, 120-2 may refer to the center distance d2 between the pixel formed in the edge area of the first modular display 120-1 and the pixel formed in the edge area of the second modular display 120-2 adjacent to each other. Here, the pixels formed in the edge areas of the first and second modular displays adjacent to each other 120-1, 120-2 may refer to two pixels wherein the seam 160 exists between them among the pixels arranged to be closest to the edges of the first and second modular displays 120-1, 120-2.

Each of the plurality of modular displays 120-1 to 120-4 may include a bonding part 135 between the substrate 130 and the plurality of LEDs 141 to 143. Here, the bonding part 135 may refer to a layer or a pattern that makes the plurality of LEDs 141 to 143 mounted (or bonded) on the substrate 130 and connected with the driving circuit included in the substrate 130. The bonding part 135 may include an insulating resin and fine conductive particles of which diameter is scores of nm that are distributively arranged on the insulating resin. For example, the bonding part 135 may be implemented as an anisotropic conductive film (ACF).

Each of the plurality of modular displays 120-1 to 120-4 may include a black matrix 150 formed between the plurality of LEDs 141 to 143. Here, the black matrix 150 may absorb an external light, and may respectively be formed in a structure of predetermined width and thickness between the plurality of LEDs 141 to 143.

In this case, the time period when the black matrix 150 is formed between the plurality of LEDs 141 to 143 may change variously. For example, after the plurality of modular displays 120-1 to 120-4 are arranged on the chassis 110, the black matrix 150 may be formed between the plurality of LEDs 141 to 143, or alternatively, after the black matrix 150 is formed in each of the plurality of modular displays 120-1 to 120-4, the plurality of modular displays 120-1 to 120-4 where the black matrix 150 is formed may be arranged on the chassis 110.

Hereinafter, explanation will be made based on the assumption that the black matrix 150 is formed between the plurality of LEDs 141 to 143.

As described above, a patterned molding layer 190 may be formed on the plurality of modular displays 120-1 to 120-4 to correspond to the boundary line between the modular displays adjacent to each other among the plurality of modular displays 120-1 to 120-4 at operation S520. Here, the patterned molding layer 190 may include a groove 180 and a plurality of molding-pieces 185.

Specifically, the patterned molding layer 190 may have a structure where molding lines are formed on the surface. In this case, the molding lines may correspond to the boundary line between the modular displays adjacent to each other 120-1, 120-2. Here, the molding lines may be formed to be in parallel with the boundary line of the modular displays 120-1 and 120-2 that are adjacent to each other. Also, the molding lines may be formed at a regular interval in a direction perpendicular to the direction of the boundary line. In addition, the plurality of molding lines may include first molding line and a second molding line in parallel with a first boundary line and a second boundary line, respectively, where the first boundary line is in one direction and the second boundary line is perpendicular to the one direction. Accordingly, the first and second molding lines may be perpendicular to each other. As described above, the plurality of molding lines may be formed in a grid structure.

Here, a plurality of molding-pieces 185 may be formed in thickness greater than or equal to the height of the plurality of LEDs 141 to 143. For example, the thickness of the plurality of molding-pieces 185 may be determined based on the height of the plurality of LEDs 141 to 143. Detailed explanation in this regard will be omitted as it will overlap with the descriptions made above in FIG. 3A and FIG. 3B.

In the forming step, each of the plurality of molding-pieces 185 may be formed in an area corresponding to at least one pixel among the plurality of pixels 140. Here, an area corresponding to at least one pixel among the plurality of pixels 140 may refer to an area wherein the entire pixels 140 arranged in the modular display 120-1 are divided uniformly by the number of at least one pixel. Detailed explanation in this regard will be omitted as it will overlap with the descriptions made above in FIG. 4A and FIG. 4B.

Figure 7:
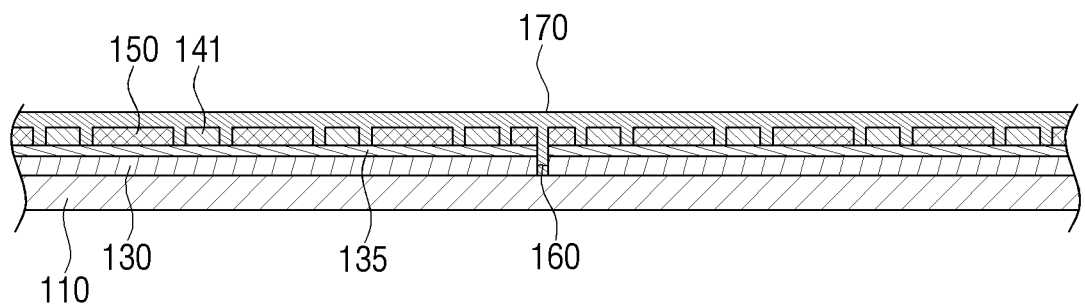
FIG. 7 is a diagram for illustrating a method of manufacturing a display apparatus according to an embodiment.
Figure 8A:
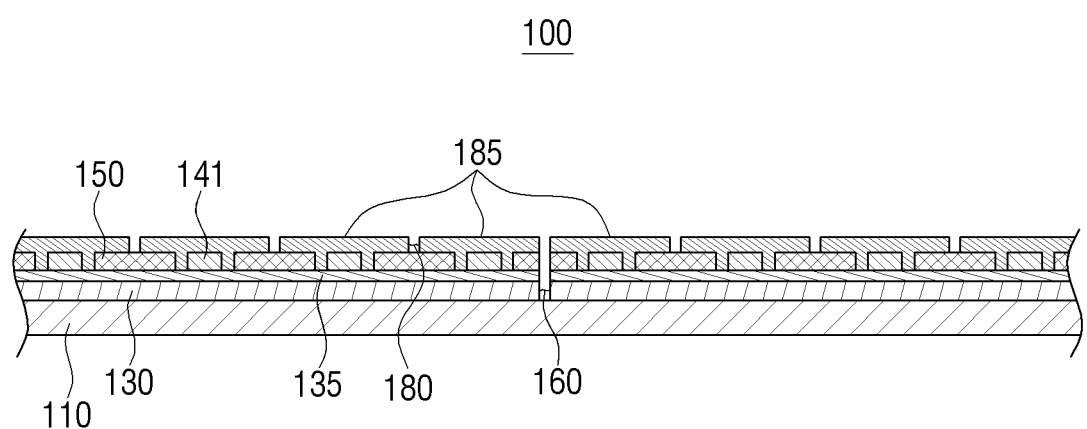
FIG. 8A is a diagram for illustrating a display apparatus according to an embodiment.

The patterning means forming the plurality of structured molding-pieces 185, and is a concept including both of forming the plurality of structured molding-pieces 185 by forming a molding layer 170 as shown in FIG. 7 and removing the molding layer 170 in the form of a grid as shown in FIG. 8A. In another embodiment, the plurality of structured molding-pieces 185 may be directly formed as shown in FIG. 8A. Hereinafter, the two cases will be described separately.

As an example, referring to FIG. 7 and FIG. 8A, the operation S520 of forming the patterned molding layer 190 may include the steps of forming a molding layer 170 on the plurality of modular displays 120-1 to 120-4, and patterning the molding layer 170 such that the plurality of molding-pieces are arranged to be distanced from one another.

According to an embodiment, referring to FIG. 7, the molding layer 170 may be formed on the plurality of modular displays 120-1 to 120-4. Here, the molding layer 170 may include resins such as silicon and epoxy.

For example, the molding layer 170 may be formed by applying a liquid composition including resins such as silicon and epoxy on the plurality of modular displays 120-1 to 120-4 by using ink-jet or a dispenser, or locating a film including resins such as silicon and epoxy on the plurality of modular displays 120-1 to 120-4 and pressurizing the film in the direction of the plurality of modular displays 120-1 to 120-4.

Afterwards, referring to FIG. 8A, the molding layer 170 may be patterned such that the plurality of molding-pieces 185 are arranged to be distanced from one another.

Specifically, by removing a specific portion in the molding layer 170, the groove 180 and the plurality of molding-pieces 185 may be formed. Here, the specific portion removed from the molding layer 170 may become the groove 180, and the portion that remains without being removed from the molding layer 170 may become the molding-pieces 185. Here, removal of the molding layer 170 may be performed by various technologies such as dry etching, wet etching, plasma etching, laser, etc. Here, the specific portion may be one of the portions located between the plurality of pixels 140 in the molding layer 170.

In this case, the portion corresponding to a grid form in the molding layer 170 may be removed so that the plurality of molding-pieces 185 can be arranged to be distanced from one another in the form of a matrix. In this case, each of the plurality of molding-pieces 185 may have the same size as one another. Specifically, the matrix form may refer to a form where the plurality of molding-pieces 185 have the same number of rows and columns (e.g., in the case of M=N, a 3×3 arrangement, a 5×5 arrangement, etc., where, M and N are natural numbers) or a form in which the plurality of molding-pieces 185 have different number of rows and columns (e.g., in the case of M N, a 3×2 arrangement, a 5×4 arrangement, etc., where, M and N are natural numbers). Also, the grid form may be the boundary line of the matrix form, and for example, it may be a form like mesh. Specifically, the grid form may be a form wherein a plurality of first parallel lines having the same intervals in the direction of the first axis and a plurality of second parallel lines having the same intervals in the direction of the second axis cross over.

Here, in the step of patterning the molding layer 170, the molding layer 170 may be patterned such that the plurality of molding-pieces 185 are arranged to be distanced from one another on the boundary line between the modular displays 120-1 and 120-2 adjacent to each other. Specifically, the portion corresponding to the boundary line may be removed from the molding layer 170, and accordingly, the plurality of molding-pieces 185 may be arranged to be distanced from one another such that they are not located on the boundary line between the modular displays adjacent to each other 120-1, 120-2.

The molding layer 170 may be patterned such that the groove 180 is formed in a location corresponding to the boundary line between the modular displays 120-1 and 120-2 adjacent to each other. That is, the groove 180 may be formed at a regular interval in a location corresponding to the boundary line between the modular displays adjacent to each other.

Specifically, the groove 180 may be located between the plurality of pixels 140, and may be formed at a regular interval in one direction. Here, the groove 180 may be formed to be in parallel with the boundary line between the modular displays 120-1 and 120-2 adjacent to each other. Here, the width of the groove 180 may be the same as the interval by which the modular displays adjacent to each other are distanced. That is, the width of the groove 180 may be the same as the width of the seam 160.

As another example, referring to FIG. 8A, the patterned molding layer 190 may be formed on the plurality of modular displays 120-1 to 120-4 to correspond to the boundary line between the modular displays 120-1 and 120-2 adjacent to each other among the plurality of modular displays 120-1 to 120-4 at operation S520. In this case, the patterned molding layer 190 may include a plurality of molding-pieces. Here, the plurality of molding-pieces may be arranged to be distanced from one another by a specific interval on the plurality of modular displays 120-1 to 120-4. That is, the plurality of molding-pieces 185 may be directly formed on the plurality of modular displays 120-1 to 120-4 at operation S520.

In this case, the plurality of molding-pieces 185 may be formed on the plurality of modular displays 120-1 to 120-4 by applying a liquid composition including resins such as silicon and epoxy on every location where the plurality of molding-pieces 185 will be formed by using ink-jet or a dispenser, spraying a liquid composition through a mask, or pressurizing a composition in the form of a film.

Specifically, the plurality of molding-pieces 185 may be formed on the plurality of modular displays 120-1 to 120-4 in the form of a matrix to correspond to the shape of the opening of the mask. For example, a method of infiltrating resins such as silicon and epoxy into the opening of a mask (or a mold) and applying pressure and heat, a method of spraying small resin drops by using ink-jet or a dispenser and then curing the drops, etc. are possible.

Figure 8B:
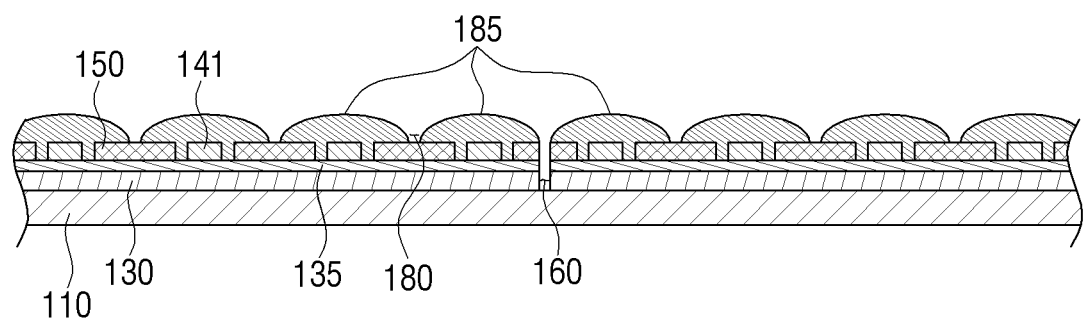
FIG. 8B is a diagram for illustrating a display apparatus according to an embodiment.
Figure 8C:
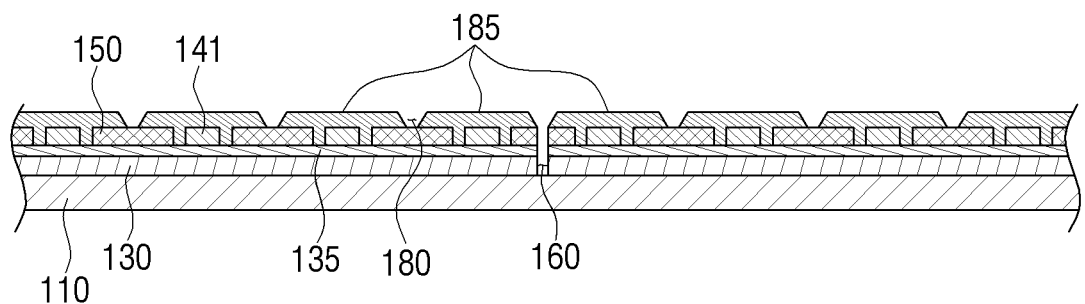
FIG. 8C is a diagram for illustrating a display apparatus according to an embodiment.

In the case of the aforementioned display apparatus 100 or the display apparatus 100 manufactured according to the manufacturing method, it was described that the cross sections of the surfaces of the molding-pieces 185 are quadrangles as shown in FIG. 8A, but this is merely an example, and the cross sections of the molding-pieces 185 may be implemented by being modified in various forms such as oval shapes or circular shapes as in the display apparatus 100-1 in FIG. 8B, or trapezoids or polygons as in the display apparatus 100-2 in FIG. 8C.

Figure 9:
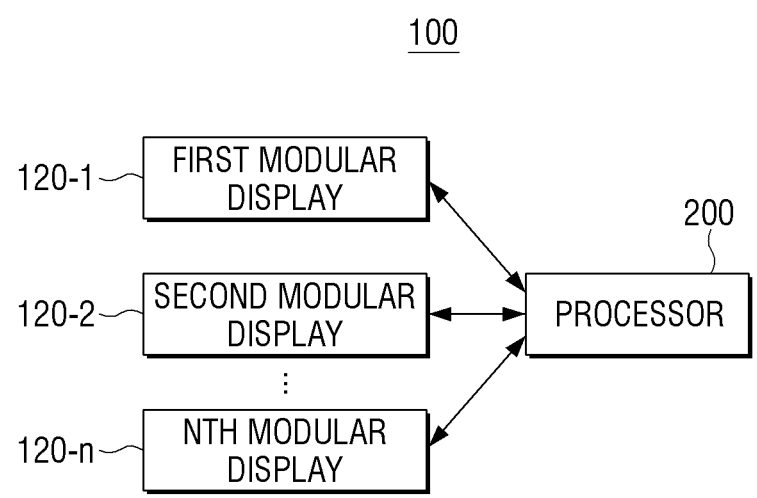
FIG. 9 is a block diagram illustrating a display apparatus according to an embodiment.

FIG. 9 is a block diagram illustrating a display apparatus according to an embodiment.

Referring to FIG. 9, the display apparatus 100 may include a plurality of modular displays 120-1 to 120-n and a processor 200.

Each of the plurality of modular displays 120-1 to 120-n may include a plurality of pixels 140 corresponding to one area of an image. Detailed content in this regard can be applied in the same way as the aforementioned description.

The processor 200 may control the overall operations of the plurality of modular displays 120-1 to 120-n. Here, the processor 200 may be implemented as including at least one of a central processing unit (CPU), a graphics processing unit (GPU), or an application processor unit (APU). In this case, the processor 200 may include a timing controller for controlling operation of the plurality of LEDs 141, 142, 143 according to time. However, this is merely an example, and the timing controller may be implemented as a separate apparatus, or implemented as a plurality of apparatuses according to the number of the plurality of modular displays 120-1 to 120-n.

Also, the processor 200 may control the plurality of display apparatuses 100-1, 100-2, . . . , 100-n to display images received from an external apparatus connected with the display apparatus 100 by wire or wirelessly or images stored in a storage apparatus included inside the display apparatus 100.

Specifically, the processor 200 may divide an image to correspond to the arrangement locations (or coordinates) of the plurality of modular displays 120-1 to 120-n, and perform control such that each of the plurality of modular displays 120-1 to 120-n displays respective divided images to form one image.

For example, referring to FIG. 1A, it is assumed that the first modular display 120-1 is arranged on the lower left end, the second modular display 120-2 is arranged on the lower right end, the third modular display 120-3 is arranged on the upper left end, and the fourth modular display 120-4 is arranged on the upper right end.

In this case, the processor 200 may divide an image into the lower left end, the lower right end, the upper left end, and the upper right end based on the arrangements of the plurality of modular displays 120-1 to 120-4. Then, the processor 200 may perform control such that the first modular display 120-1 arranged on the lower left end displays the lower left end area of the image, the second modular display 120-2 arranged on the lower right end displays the lower right end area of the image, the third modular display 120-3 arranged on the upper left end displays the upper left end area of the image, and the fourth modular display 120-4 arranged on the upper right end displays the upper right end area of the image.

As described above, the processor 200 may control the plurality of modular displays 120-1 to 120-n to display an entire image.

According to the various embodiments described above, a display apparatus may be configured as an integrated display and a manufacturing method thereof can be provided.

In addition, the various embodiments may be implemented as software including instructions stored in machine-readable storage media, which can be read by machines (e.g., computers). Here, the machines refer to apparatuses that call instructions stored in a storage medium, and can operate according to the called instructions, and the apparatuses may include the display apparatus 100 according to the embodiments described in the disclosure.

In case an instruction as described above is executed by a processor, the processor may perform a function corresponding to the instruction, or by using other components under its control. An instruction may include code that is generated or executed by a compiler or an interpreter. A storage medium that is readable by machines may be provided in the form of a non-transitory storage medium. Here, the term 'non-transitory' may mean that a storage medium does not include signals, and is tangible, but does not indicate whether data is stored in the storage medium semi-permanently or temporarily.

According to an embodiment, the method according to the various embodiments described in the disclosure may be provided while being included in a computer program product. A computer program product refers to a product, and it can be traded between a seller and a buyer. A computer program product can be distributed on-line in the form of a storage medium that is readable by machines (e.g., a compact disc read only memory (CD-ROM)), or through an application store (e.g., Play Store™). In the case of on-line distribution, at least a portion of a computer program product may be stored in a storage medium such as the server of the manufacturer, the server of the application store, and the memory of the relay server at least temporarily, or may be generated temporarily.

In addition, each of the components (e.g., a module or a program) according to the various embodiments may include a singular object or a plurality of objects. Also, among the aforementioned corresponding sub components, at least some sub components may be omitted, or other sub components may be further included in the various embodiments. Generally or additionally, some components (e.g., a module or a program) may be integrated as an object, and perform the functions that were performed by each of the components before integration identically or in a similar manner. Further, operations performed by a module, a program, or other components according to the various embodiments may be executed sequentially, in parallel, repetitively, or heuristically. Furthermore, at least some of the operations may be executed in a different order or omitted, or other operations may be added.

The descriptions above are merely examples of the disclosure, and various modifications may be made by those having ordinary skill in the art, to which the disclosure belongs, within the scope of the disclosure. Also, the embodiments of the disclosure are not intended to limit the scope of the disclosure, but for explaining the technical idea, and the scope of the technical idea of the disclosure and is not limited by the embodiments. Accordingly, the scope of protection of the disclosure should be interpreted based on the appended claims, and all technical ideas within an equivalent scope thereto should be interpreted to belong to the scope of protection of the disclosure.

What is claimed is:
1. A display apparatus comprising:
a chassis;
a plurality of modular displays disposed and tiled on the chassis, each of the plurality of modular displays comprising a plurality of light emitting diodes (LEDs) constituting each of a plurality of pixels;
a black matrix formed between the plurality of LEDs; and
a patterned molding layer formed on the each of the plurality of modular displays,
wherein the patterned molding layer is formed to correspond to a boundary line between modular displays adjacent to each other among the plurality of modular displays,
wherein the patterned molding layer comprises a plurality of molding-pieces,
wherein the plurality of molding-pieces are arranged to be distanced from one another,
wherein the patterned molding layer comprises a groove which is formed between the plurality of molding-pieces,
wherein the plurality of molding pieces are formed on a part of the black matrix such that a remaining part of the black matrix is exposed through the groove, and
wherein a width of the groove is equal to a width of the boundary line.

2. The display apparatus of claim 1, wherein each of the plurality of molding-pieces is formed in an area corresponding to at least one pixel among the plurality of pixels.

3. The display apparatus of claim 1, wherein a thickness of the plurality of molding-pieces is greater than or equal to a height of the plurality of LEDs.

4. The display apparatus of claim 1, wherein the each of the plurality of modular displays is arranged so as to be tiled without a step difference between the plurality of modular displays adjacent to each other.

5. The display apparatus of claim 4, wherein the plurality of modular displays are arranged on the chassis such that a first interval between a first set of pixels formed in each edge area of a first modular display and a second modular display that are adjacent to each other is equal to a second interval between a second set of pixels adjacent to each other and formed in any one modular display among the plurality of modular displays.

6. A manufacturing method of a display apparatus comprising a plurality of modular displays, wherein each of the plurality of modular displays comprises a plurality of light emitting diodes (LEDs) constituting each of a plurality of pixels, the method comprising:
arranging the plurality of modular displays on a chassis so as to be tiled; and
forming a patterned molding layer on the each of the plurality of modular displays, the patterned molding layer corresponding to a boundary line between modular displays adjacent to each other among the plurality of modular displays,
wherein the each of the plurality of modular displays comprises a black matrix formed between the plurality of LEDs,
wherein the forming the patterned molding layer comprises:
forming a molding layer on the plurality of modular displays; and
patterning the molding layer such that a plurality of molding-pieces are arranged to be distanced from one another, and
wherein the patterning the molding layer comprises patterning the molding layer such that a groove is formed between the plurality of molding-pieces, a part of the black matrix is exposed through the groove, and a width of the groove is equal to a width of the boundary line.

7. The manufacturing method of claim 6, wherein the patterning the molding layer further comprises patterning the molding layer such that each of the plurality of molding-pieces is formed in an area corresponding to at least one pixel among the plurality of pixels.

8. The manufacturing method of claim 6, wherein the patterning the molding layer further comprises patterning the molding layer such that the plurality of molding-pieces are formed to have a thickness greater than or equal to a height of the plurality of LEDs.

9. The manufacturing method of claim 6, wherein the arranging the plurality of modular displays further comprises arranging the plurality of modular displays so as to be tiled without a step difference between the plurality of modular displays adjacent to each other.

10. The manufacturing method of claim 9, wherein the arranging the plurality of modular displays further comprises arranging the plurality of modular displays on the chassis such that a first interval between a first set of pixels formed in each edge area of a first modular display and a second modular display that are adjacent to each other is equal to a second interval between a second set of pixels adjacent to each other and formed in any one modular display among the plurality of modular displays.

* * * * *